United States Patent [19]
Fjelstad et al.

[11] Patent Number: 5,980,270
[45] Date of Patent: *Nov. 9, 1999

[54] SOLDERING WITH RESILIENT CONTACTS

[75] Inventors: Joseph Fjelstad, Sunnyvale; Thomas H. DiStefano, Monte Sereno; John W. Smith, Palo Alto, all of Calif.

[73] Assignee: Tessera, Inc., San Jose, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/753,539

[22] Filed: Nov. 26, 1996

Related U.S. Application Data

[60] Division of application No. 08/410,324, Mar. 24, 1995, Pat. No. 5,615,824, which is a continuation-in-part of application No. 08/306,205, Sep. 14, 1994, Pat. No. 5,632,631, which is a continuation-in-part of application No. 08/254,991, Jun. 7, 1994, Pat. No. 5,802,699.

[51] Int. Cl.$^6$ ........................................ H01R 9/09
[52] U.S. Cl. .............................. 439/71; 228/180.22
[58] Field of Search ................ 439/71; 228/180.22; 257/738, 778

[56] References Cited

U.S. PATENT DOCUMENTS

| | | | |
|---|---|---|---|
| 3,275,736 | 9/1966 | Hotine . | |
| 3,509,270 | 4/1970 | Dube et al. | 174/68 |
| 3,616,532 | 11/1971 | Beck | 29/625 |
| 3,670,409 | 6/1972 | Reimer | 439/55 |
| 3,797,103 | 3/1974 | Desmond et al. | 437/183 |
| 3,818,415 | 6/1974 | Evans et al. | 439/393 |
| 3,937,386 | 2/1976 | Hartleroad et al. | 228/180 |
| 3,998,377 | 12/1976 | Metz | 228/180 |
| 4,283,839 | 8/1981 | Gursky | 29/589 |
| 4,295,596 | 10/1981 | Doten et al. | 228/180 |
| 4,597,617 | 7/1986 | Enochs | 439/66 |
| 4,655,519 | 4/1987 | Evans et al. | 439/74 |
| 4,695,870 | 9/1987 | Patraw | 361/820 |
| 4,696,096 | 9/1987 | Green et al. | 29/829 |
| 4,716,049 | 12/1987 | Patraw | 437/228 |
| 4,783,719 | 11/1988 | Jamison et al. | 439/68 |
| 4,818,728 | 4/1989 | Rai et al. | 437/209 |

(List continued on next page.)

FOREIGN PATENT DOCUMENTS 8502751   6/1985   WIPO .

OTHER PUBLICATIONS

1994 ITAP & Flip Chip Proceedings, "A Tab Tape–Based bare Chip Test and Burn–In Carrier", Nolan et al. (pp. 173–179).
1994 ITAP & Flip Chip Proceedings, "Mechanical Interconnection System For Solder Bump Dice", Hill et al. (pp. 82–86).
Multichip Module Technologies and Alternatives: The Basics, Alan D. Knight, (pp. 504–509; 521–523).
IEEE Transaction on Components, Packaging and Manufacturing Technology, Part A, vol. 18, No. 2, Jun. 1995, "Constriction Resistance of Microcone–Based Contacts".
Design News, Jan. 17, 1994, "Tiny Filter Quashes EMI".
Electronic Buyers' News, Issue 867, Aug. 16, 1993, "Quieting Connectors Down" by David Gabel.
TRW Data Technologies 1994 Brochure.

*Primary Examiner*—Neil Abrams
*Assistant Examiner*—T C Patel
*Attorney, Agent, or Firm*—Lerner, David, Littenberg, Krumholz & Mentlik, LLP

[57] ABSTRACT

A method of making a solder connection. An element bearing a solder mass is forcibly engaged with another element bearing a resilient metallic contact so that the contact wipes the surface of the solder mass and so that the contact is deformed and bears against the wiped surface. While the contact is in its deformed condition, the contact and solder mass are brought to an elevated bonding temperature sufficient to soften the solder, so that the contact penetrates into the solder mass under the influence of its own resilience. The contact bonds with the pure solder inside the solder mass, so that the effective bonding can be achieved even without flux.

34 Claims, 5 Drawing Sheets

U.S. PATENT DOCUMENTS

| | | | |
|---|---|---|---|
| 4,821,947 | 4/1989 | Nowotarski | 228/219 |
| 4,846,704 | 7/1989 | Ikeya | 439/72 |
| 4,887,760 | 12/1989 | Yoshino et al. | 228/56.3 |
| 4,893,172 | 1/1990 | Matsumoto et al. | 174/254 |
| 4,902,606 | 2/1990 | Patraw | 439/66 |
| 4,913,336 | 4/1990 | Yamazaki | 228/106 |
| 4,924,353 | 5/1990 | Patraw | 361/783 |
| 4,937,006 | 6/1990 | Bickford et al. | 228/219 |
| 4,950,173 | 8/1990 | Minemura et al. | 439/82 |
| 4,950,623 | 8/1990 | Dishon | 437/183 |
| 4,975,079 | 12/1990 | Beaman et al. | 439/482 |
| 5,006,792 | 4/1991 | Malhi et al. | 439/68 |
| 5,006,917 | 4/1991 | Kang et al. | 257/162 |
| 5,046,953 | 9/1991 | Shreeve et al. | 439/66 |
| 5,046,957 | 9/1991 | Milchimes | 439/83 |
| 5,048,746 | 9/1991 | Elliott et al. | 228/180.1 |
| 5,053,922 | 10/1991 | Matta et al. | 361/720 |
| 5,057,969 | 10/1991 | Ameen et al. | 361/720 |
| 5,086,337 | 2/1992 | Noro et al. | 257/726 |
| 5,092,034 | 3/1992 | Altendorft et al. | 29/840 |
| 5,115,964 | 5/1992 | Ameen et al. | 228/180.22 |
| 5,123,850 | 6/1992 | Elder et al. | 439/67 |
| 5,131,852 | 7/1992 | Grabbe et al. | 439/71 |
| 5,133,495 | 7/1992 | Angulas et al. | 228/180.1 |
| 5,152,695 | 10/1992 | Grabbe et al. | 439/71 |
| 5,154,341 | 10/1992 | Melton et al. | 228/180.22 |
| 5,173,055 | 12/1992 | Grabbe | 439/66 |
| 5,181,859 | 1/1993 | Foreman et al. | 439/225 |
| 5,196,726 | 3/1993 | Nishiguchi et al. | 257/737 |
| 5,199,879 | 4/1993 | Kohn et al. | 439/63 |
| 5,203,075 | 4/1993 | Angulas et al. | 228/180.22 |
| 5,207,585 | 5/1993 | Byrnes et al. | 439/66 |
| 5,228,861 | 7/1993 | Grabbe | 439/66 |
| 5,230,632 | 7/1993 | Baumberger et al. | 439/74 |
| 5,261,155 | 11/1993 | Angulas et al. | 29/830 |
| 5,261,593 | 11/1993 | Casson et al. | 228/180.22 |
| 5,281,684 | 1/1994 | Moore et al. | 427/96 |
| 5,282,312 | 2/1994 | DiStefano et al. | 29/830 |
| 5,282,565 | 2/1994 | Melton | 228/180.22 |
| 5,311,402 | 5/1994 | Kobayashi et al. | 439/65 |
| 5,328,087 | 7/1994 | Nelson et al. | 228/175 |
| 5,346,118 | 9/1994 | Degani et al. | 228/180.22 |
| 5,349,495 | 9/1994 | Visel et al. | 361/774 |
| 5,349,500 | 9/1994 | Casson et al. | 439/55 |
| 5,354,205 | 10/1994 | Feigenbaum et al. | 439/67 |
| 5,417,362 | 5/1995 | Chiyonobu et al. | 228/180.1 |
| 5,430,614 | 7/1995 | Difrancesco | 361/785 |
| 5,475,241 | 12/1995 | Harrah et al. | 257/99 |
| 5,489,750 | 2/1996 | Sakemi et al. | 29/832 |
| 5,500,605 | 3/1996 | Chang | 324/758 |

SOLDERING WITH RESILIENT CONTACTS

CROSS REFERENCE TO RELATED APPLICATIONS

The present application is a division of Ser. No. 08/410,324, filed Mar. 24, 1995 now U.S. Pat. No. 5,615,824, which is a continuation-in-part of application Ser. No. 08/306,205 filed Sep. 14, 1994, now U.S. Pat. No. 5,632,631, which is a continuation-in-part of application Ser. No. 08/254,991 filed on Jun. 7, 1994 now U.S. Pat. No. 5,802,699. The disclosures of the aforesaid patents and patent application are hereby incorporated by reference herein.

BACKGROUND OF THE INVENTION

The present invention relates to soldered connections for microelectronic devices such as semiconductor chips and the associated circuit panels, and to methods of making and using such connections.

Microelectronic circuits require numerous connections between elements. For example, a semiconductor chip may be connected to a small circuit panel or substrate, whereas the substrate may in turn be connected to a larger circuit panel. The chip to substrate or "first level" interconnection requires a large number of individual electrical input and output ("I/O") as well as power and ground connections. As chips have become progressively more complex, the number of I/O connections per chip has grown so that hundreds of connections or more may be needed for a single chip. To provide a compact assembly, all of these connections must be made within a relatively small area, desirably an area about the area of the chip itself. Thus, the connections must be densely packed, preferably in an array of contacts on a regular grid, commonly referred to as a "Bump Grid Array" or "BGA". The preferred center-to-center distance between contacts or "contact pitch" for chip mountings is on the order of 1.5 mm or less, and in some cases as small as 0.5 mm. These contact pitches are expected to decrease further. Likewise, chip mounting substrates and other circuit panels used in microelectronics have become progressively more miniaturized, with progressively greater numbers of electrical conductors per unit area. Connectors for these miniaturized panel structures desirably also have very small contact pitch. Connections of chip mounting substrates to other elements are referred to as "second-level" interconnections.

Microelectronic connections must meet numerous, often conflicting requirements. As mentioned above, the size of the device poses a major concern. Further, such connections often are subject to thermal cycling strains as temperatures within the assembly change. The electrical power dissipated within a chip or other microelectronic element tends to heat the elements so that the temperatures of the mating elements rise and fall each time the device is turned on and off. As the temperatures change, the various connected elements expand and contract by different amounts, tending to move the contacts on one element relative to the mating contacts on the other element. Changes in the temperature of the surrounding environment can cause similar effects which produce mechanical stress in the connected components.

The connections must also accommodate manufacturing tolerances in the contacts themselves and in the connected elements. Such tolerances may cause varying degrees of misalignment. Additionally, contamination on the surfaces of the mating contact parts can interfere with the connection. Therefore, the contact system should be arranged to counteract the effects of such contaminants. For example, in making soldered connections, oxides and other contaminants must be removed by fluxes. These fluxes in turn can contaminate the finished product. Although these fluxes can be removed by additional cleaning steps, or can be formulated to minimize ill-effects on the finished product, it would be desirable to provide soldered connections which minimize or eliminate the need for such fluxes. All of these requirements, taken together, present a formidable engineering challenge.

Various approaches have been adopted towards meeting these challenges.

Certain preferred embodiments disclosed in our aforementioned U.S. patent application Ser. No. 08/254,991 provide connectors for mounting a microelectronic element such as a semi-conductor chip or other element. Connectors according to these embodiments include a planar dielectric body having first and second surfaces and also having a plurality of holes open to the first surface. The holes are disposed in an array corresponding to an array of bump leads on the device to be mounted. The connector further includes an array of resilient contacts secured to the first surface of the dielectric body in registration with the holes so that each such contact extends over one hole. Each contact is adapted to resiliently engage a bump lead inserted into the associated hole. A chip or other microelectronic component with the bump leads thereon can be connected to the contacts by superposing the microelectronic element on the dielectric body of the connector so that the microelectronic element overlies the first surface and so that the bump leads on the element protrude into the holes and are engaged by the resilient contacts. Preferred connector components according to this aspect of the invention will establish electrical connection with the bump leads by mechanical interengagement of the bump leads and contacts.

Each contact may include a structure such as a ring of a sheet-like metallic contact material overlying the first surface of the dielectric body and fully or partially encircling the opening of the associated hole, and each contact may also include one or more projections or tabs formed integrally with the ring and extending inwardly therefrom over the hole. Preferably, a plurality of such projections are provided at circumferentially-spaced locations around the hole. These projections are arranged so that when a bump lead enters the hole, it tends to force the projections downwardly and outwardly, away from one another. The projections tend to center the bump in the hole. The chip or other microelectronic component can be reliably connected simply by pressing the chip against the connector in proper alignment with the holes. This reliable interconnection can be used either as a temporary interconnection for testing purposes or as a permanent connection.

As set forth in the '991 application, the motion of the bump leads entering the holes as the microelectronic element is engaged with the connector causes the bump leads to wipe across the contacts so as to clean debris, oxides and other contaminants from the surfaces of the contact and bump lead. The bump leads may include a bonding material such as a solder, to form a permanent metallurgical connection with the contacts. Thus, the microelectronic component can be engaged with the connector and tested using the mechanically-made electrical interconnections. If the results are satisfactory, the permanent metallurgical bond can be formed by heating to melt the solder.

Certain aspects of our U.S. Pat. No. 5,632,631 provide contacts for a microelectronic device, which contacts can be used in the connectors of the '991 application and in other structures. According to these aspects of the '631 Patent, each contact includes a base portion defining a base surface, and one or more asperities preferably integral with the base portion and protruding upwardly from the base surface. Each such asperity desirably defines a tip remote from the base surface and a substantially sharp feature at the tip. The base portion of each contact may include one or more metallic layers such as copper or copper-bearing alloys, and may also include a polymeric structural layer in addition to a conductive, desirably metallic, layer.

The base portion of each contact may include an anchor region and at least one tab or projection formed integrally with the anchor region. The asperity or asperities may be disposed on each tab at a distal end, remote from the anchor region. In use, the anchor region of such a contact is fixed to a connector body or other support, whereas the tab is free to bend. When a bump lead is engaged with the tab, the tab bends and the mating bump lead and tab move relative to one another to provide a wiping motion. The resilience of the tab causes the sharp feature of the asperity to bear on the mating element and scrape the mating element. The scraping action promotes reliable contact before bonding, as well as reliable bonding. The anchor region of each contact may be part of a substantially ring-like common anchor region. A contact unit may include such common anchor region and a plurality of tabs extending inwardly from the ring-like anchor region towards a common center.

SUMMARY OF THE INVENTION

One aspect of the present invention provides methods of making an electrical connection. A method according to this aspect of the invention preferably includes the step of forcibly engaging a first element bearing one or more masses of an electrically conductive fusible bonding material such as a solder or other fusible conductive composition and a second element bearing one or more resilient, electrically conductive contacts so that the contact wipes the surface of the mass and so that the contact is deformed and bears against the wiped surface. The method further includes the step of bringing the contact and the mass to an elevated bonding temperature sufficient to soften the fusible bonding material, so that the contact penetrates into the mass under the influence of its own resilience and then cooling the engaged contact and mass. The heating step typically is performed after the engaging step, during the engaging step the solder mass is cool and solid. Most preferably, the engaging step is performed so that the contacts wipe the surfaces of the masses during the engagement step. Most preferably, each contact has one or more asperities on its surface. Typically, the heating and cooling steps are performed by heating and cooling the entire assembly, including both elements.

When the fusible material is heated and softened, and the contacts penetrate into the masses, each contact is exposed to substantially pure fusible material. For example, where the fusible material is a solder, each contact is exposed to substantially pure solder, free of oxides and other impurities found at the solder mass surfaces. This facilitates formation of a sound, metallurgical bond between the solder and the contact. Fluxes need not be utilized to remove the impurities from the surfaces of the solder masses. The contacts may incorporate oxidation-resistant materials at the regions which penetrate into the solder during the process. This further facilitates formation of the solder joint without the use of fluxes.

Although the present invention is not limited by any theory of operation, it is believed that the wiping action tends to rupture the film or layer of oxide which may be present on the surfaces of the solder masses, and thus facilitates penetration of the contacts into the underlying pure solder during the subsequent heating and softening steps. These contacts desirably are provided with sharp-featured asperities in the region which scrape the surfaces of the solder masses.

Further aspects of the present invention include bonded articles. An article according to this aspect of the invention includes a first element having a structure with at least one terminal thereon, masses of a bonding material such as a solder and a second element having a body with one or more contacts thereon, each such contact including an anchor portion secured to the body and at least one tab projecting from the anchor portion and having a distal end remote therefrom. The distal end of each such tab projects into one mass of bonding material on the first element and is bonded thereto. Preferably, the bonding material is a solder and the distal end of each tab is metallurgically bonded to the mass. Each tab desirably is bonded to a portion of the mass remote from the surface of the mass. Most preferably, each contact incorporates an annular anchor region defining a central axis and a plurality of tabs projecting inwardly towards such central axis. Each mass is received within the annular anchor portion of one such contact and is penetrated by the radially inwardly extending tabs of such contact. Desirably, tabs penetrate into each mass into many directions, so that the tabs substantially surround the mass. As further discussed below, connections according to this aspect of the invention provide particularly strong interconnections, even where the individual tabs are quite small and hence quite fragile.

These and other objects, features and advantages of the present invention will be more readily apparent from the detailed description of the preferred embodiments set forth below, taken in conjunction with the accompany drawings

DETAILED DESCRIPTION OF THE PREFERRED EMBODIMENTS

Figure 1:
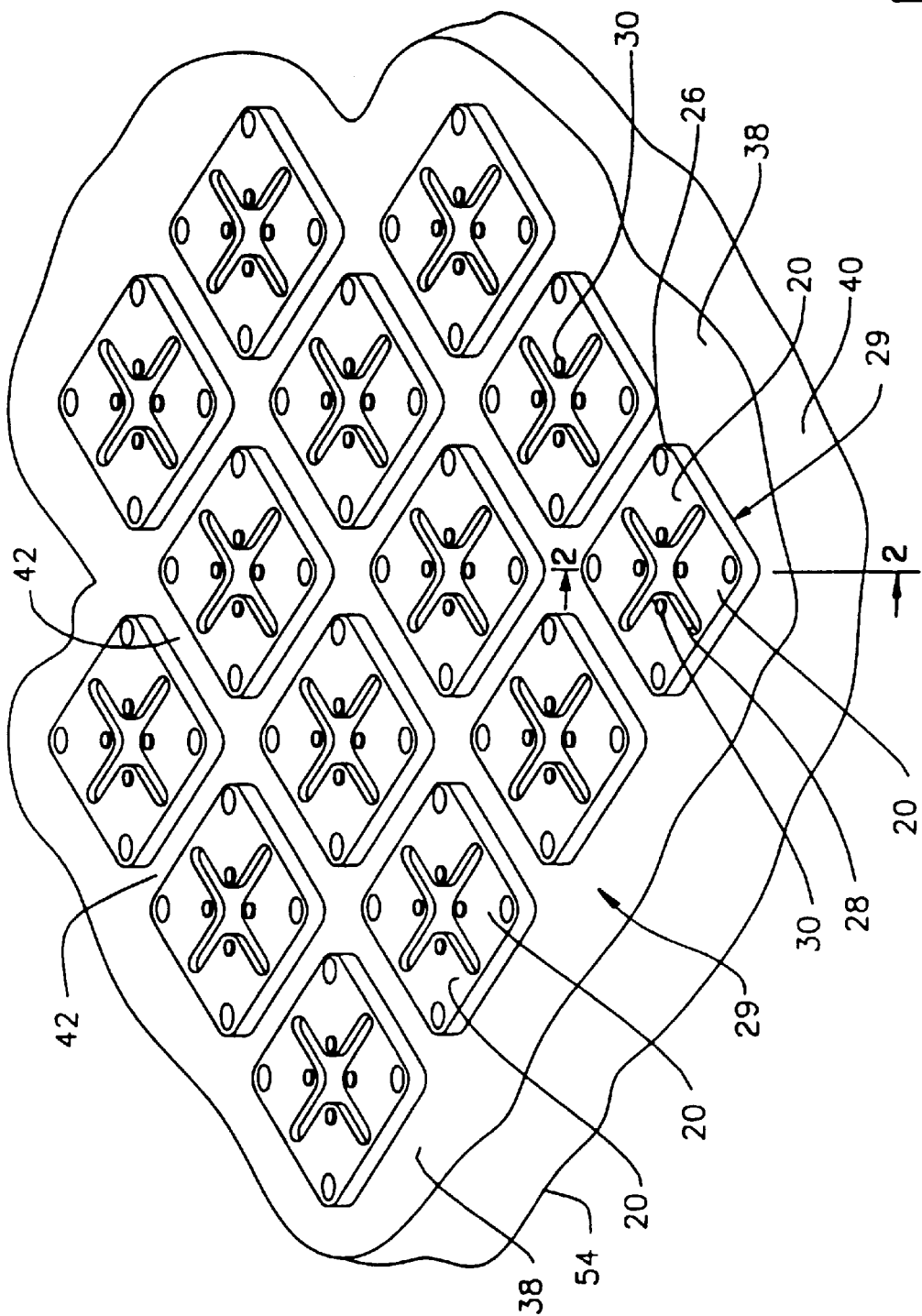
FIG. 1 is a fragmentary, diagrammatic perspective view depicting portions of a connector used in one embodiment of the present invention.

A connector useful in one embodiment of the invention may be substantially in accordance with certain embodiments of the aforementioned co-pending applications. The connectors include a plurality of independent, electrical contact units 29. Each contact unit includes four contacts 20. Each contact 20 includes a small metallic tab incorporating a base layer 22 (FIG. 2) defining an upwardly facing base surface 24. The base portion of each contact desirably is formed from a resilient metal selected from the group consisting of copper, copper-bearing alloys, stainless steel and nickel. Beryllium copper is particularly preferred. The base portion desirably may be between about 10 and about 25 microns thick. A layer 25 of an etch-resistant metal such as nickel or gold used in the contact formation process may be disposed on base surface 24. Layer 25 desirably is between about 0.5 and 2.0 microns thick. Each such tab is joined to a generally square, ring-like anchor portion 26 integral with the tab. Each tab has a tip 28 at the distal end of the tab remote from the anchor portion.

Four tabs extend inwardly from each anchor portion 26, the tabs being separated from one another by channels 23. Each contact or tab 20 has an asperity 30 projecting upwardly from the base surface 24 adjacent the tip 28 or distal end of the tab, remote from the anchor portion. Each asperity includes a column 32 of a first or base metal integral with base portion 22 and further includes a cap 34 overlying the column 32 at the uppermost tip of the asperity, remote from base surface 24. Each column 32 is generally cylindrical or frustoconical in shape, so that the tip of each column is substantially circular. The cap of each column defines a flat, circular tip surface and substantially sharp edge 36 encircling the tip surface. Each asperity desirably protrudes upwardly from the base surface less than about 100 microns, more preferably between about 5 microns and about 40 microns, and most preferably between about 12 microns and about 25 microns. Each asperity may be between about 12 and about 75 microns in diameter, more preferably about 12 to about 35 microns in diameter. The cap metal 34 may be selected from the group consisting of metals resistant to etching by etchants which etch the first or base metal. Cap metals selected from the group consisting of gold, silver, platinum, palladium, osmium, rhenium, nickel, tin and combinations thereof are preferred. As discussed in detail in the aforementioned '631 Patent, such etch-resistant metals aid in formation of sharp edges 36. Thus, in formation of the contact, the etch-resistant metal may act as an etch mask during etching of the base layer to form columns 32. Moreover, the harder etch-resistant metals, particularly nickel, osmium and rhenium, aid in preserving the edge during use. The contact surface which will engage the solder mass in use includes the surface of the base portion adjacent the contact tip and also includes the cap metal. Desirably, the contact surface includes one or more metals solderable metals selected from the group including tin copper, silver, lead, palladium, gold and alloys and combinations thereof. For example, the contact surface may include alloys such as copper-silver, lead-tin, and gold-tin.

The contact units are disposed on the top surface 38 of a connector body 40, and spaced apart from one another so that there are slots 42 between adjacent connector units. Connector body 40 incorporates a sheet-like structural support layer 44 having holes 46 therein. Support layer 44 can be formed from a metal such as copper or from a dielectric material such as fiber reinforced polymers, or unreinforced polymers. The structural support is covered by a bottom dielectric layer 48 and a top dielectric layer 50, which merge with one another within holes 46, so that the dielectric layer cooperatively lines the holes as well. A conductive metallic via liner 52 extends through each hole 46 from the top surface 38 of the connector body to the opposite, bottom surface 54. Each via liner 52 flares radially outwardly, away from the central axis 56 of the associated hole at the bottom surface so as to form an annular terminal 58 at such bottom surface. Each via liner also flares outwardly, away from the central axis at the top surface 38 so as to form a contact support structure 60. The periphery of each contact support is generally square.

One contact unit 29 is disposed on each contact support structure 60, substantially in alignment with the square boundary thereof. Each contact unit is secured to the associated contact support by four posts 66 formed integrally with the contact support 60 and extending upwardly through holes 64 in the contact unit. Each post 92 has a bulbous portion 68 at the end of the post remote from the contact support 60, overlying base surface 24. These posts and bulbous portions thus secure each contact unit 29 to the corresponding contact support 60 so that the individual contacts or tabs 20, and particularly the tips 28 thereof, protrude radially inwardly, toward the axis 56 of the associated hole 46 in the connector body and so that tips of the contacts or tabs 20 overly the hole 46. The posts and the contact supports 60 also electrically connect each contact unit to the associated via liner and thus to the terminal 58 on the bottom surface.

Figure 2:
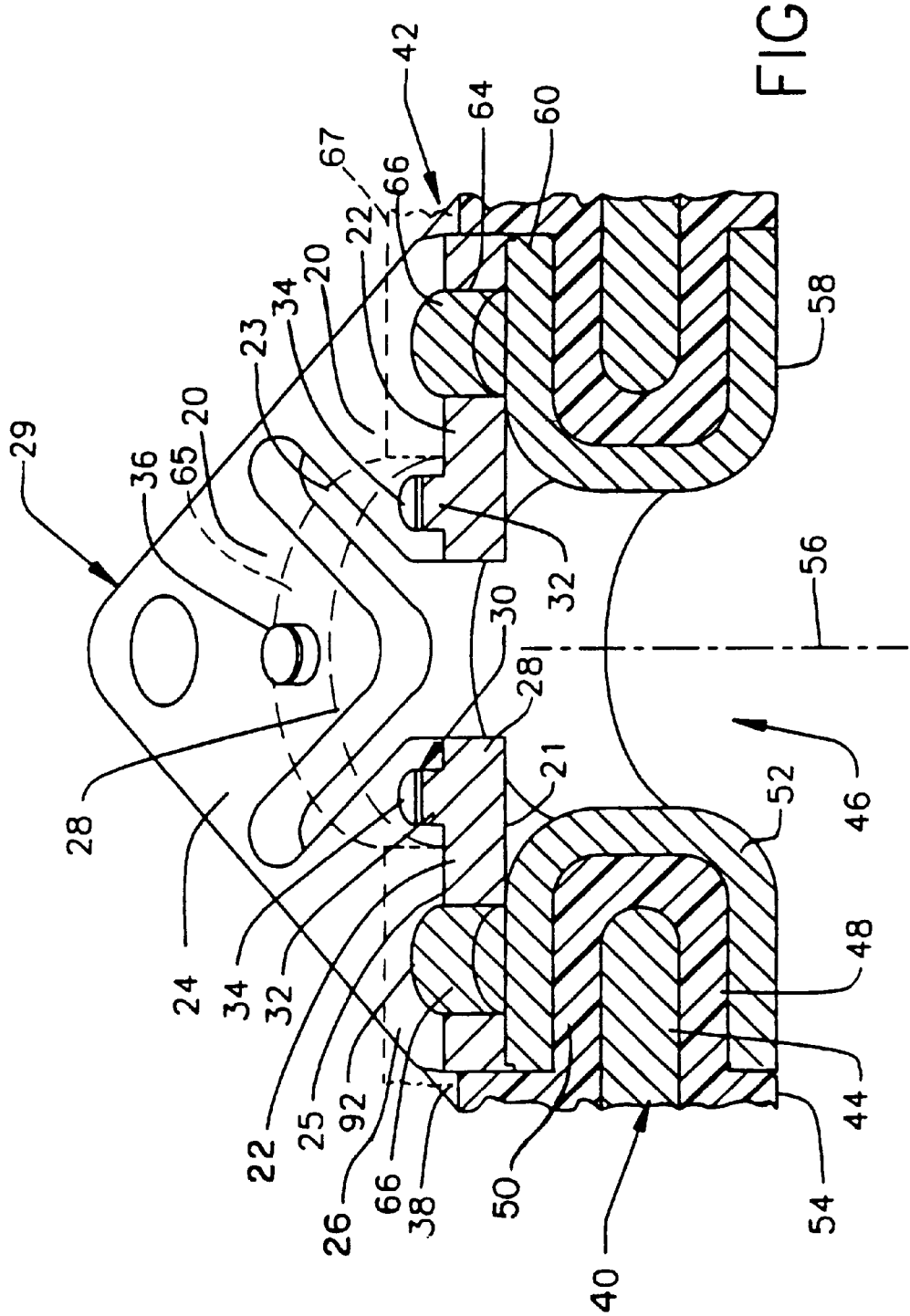
FIG. 2 is a fragmentary, diagrammatic partially sectional view on an enlarged scale along lines 2—2 in FIG. 1.

Contact units 29, and hence the individual contacts or tabs 20 are disposed in a regular pattern corresponding to the patterns of holes 46 in body 40. The asperities 30 on the contacts are also disposed in a regular pattern, in registration with the pattern of contacts 20, so that the same number of asperities are disposed on each contact. In the embodiment of FIGS. 1 and 2, only one asperity is disposed on each contact. However, because both the asperities and the contacts are disposed in regular patterns, all of the contacts are provided with asperities. Also, the asperity on each contact is at the same location namely, adjacent the tip of the tab or contact, remote from the anchor region of the contact unit. A layer of a conventional photographically patternable solder mask material 67, shown in broken-line phantom view in FIG. 2 for clarity of illustration, covers the top surfaces of the connector body and contact unit. Solder mask layer 67 is provided with holes aligned with the holes 46 in the connector body and with the central axes 56 of the holes and contact units. The tips or distal ends 28 of the contact tabs are exposed within the holes 65 of the solder mask layer, whereas the anchor portions of the contact units, and the proximal ends of the tabs adjacent-the anchor portions are covered by the solder mask layer. The solder mask layer may be formed from photoimagable polymers or from other polymers such as epoxies and polyimide. Thermoplastic materials such as polyetherimide (available under the registered trademark Ultem) and fluorocarbons, particularly fluorinated ethylene-propylene ("FEP") may also be used.

The connector of FIGS. 1 and 2 may be engaged with a larger substrate, such as a multilayer substrate 68 having leads 69. The terminals 58 of the connector, and thus the contact units 29, may be electrically connected to the internal leads 69 of the substrate by conventional lamination and/or solder bonding methods, or by the lamination and interconnection methods taught in U.S. Pat. No. 5,282,312, the disclosure which is hereby incorporated by reference herein.

After assembly to the substrate, the connector of FIGS. 1 and 2 is engaged with a mating microelectronic element 70. Microelectronic element 70 may be an active microelectronic device such as a semiconductor chip, or may be a circuit-bearing substrate or panel or other device. The microelectronic element has a body having a rear surface 75 with terminal 73 thereon connected to other electronic circuitry or components of the microelectronic element (not shown). Terminals 73 are disposed in an array matching the array of contact units 29 and holes 46 on the connector. A mass of solder 72 is disposed on each terminal 73. The solder masses are in the form of bumps protruding upwardly from surface 75. The solder masses desirably include one or more metals selected from the group consisting of lead, tin, silver, indium and bismuth. Lead-tin alloys; lead-in-silver alloys; or indium-bismuth alloys may be used.

In a process according to one embodiment of the invention, the rear surface 75 of microelectronic element 70 is placed adjacent the front surface 38 of the connector body 40.

Figure 3:
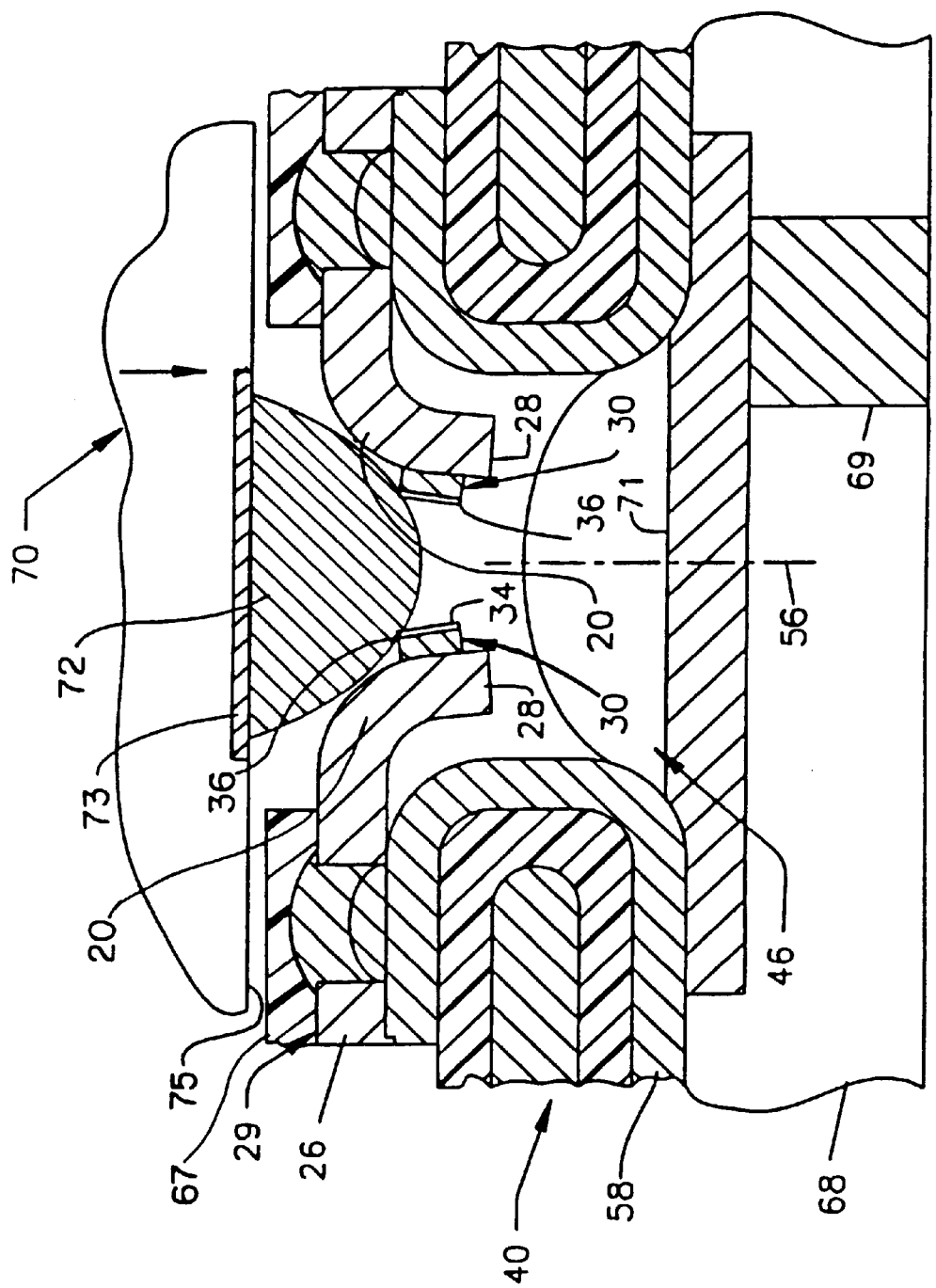
FIG. 3 is a view similar to FIG. 2 but illustrating the connector during one state of a process in accordance with one embodiment of the invention.

The terminal 73 and solder mass 72 on the microelectronic element are aligned with the hole 46 in the connector body and hence with the central axes 56 of the contact units and holes. During this stage of the process, the solder mass are at a temperature substantially below the melting temperature of the solder and therefore are in a substantially solid, rigid condition. The surface of each solder mass bears on the tabs of the associated contact unit adjacent the tip or distal end of the tab. At least during some portions of this engagement step, the solder units engage each tab by means of the asperity 30 on the tab. The microelectronic element is then forcibly engaged with the connector by forcing the microelectronic element toward the top surface of the connector body. As illustrated in FIG. 3, the anchor portion or periphery 26 of each contact unit remains substantially in fixed position, whereas the distal regions of each tab 20, adjacent the tips 28 of the tabs, bend downwardly, in the direction of motion of the engaged solder mass 72. In this condition, a part of each sharp edge 36 faces upwardly, in the direction opposite to the downward motion of microelectronic element 70 and solder masses 72. The tip 28 of each tab, and the asperity on such tip are biased inwardly, towards the central axis 56 of the hole, by the resilience of the tab 20. The upwardly facing portion of each edge 36 tends to dig into the surface of a solder mass 72. The sharp-edged asperity on each tab thus scrapes a path along the surface of the solder mass 72.

This scraping action effectively removes oxides and other contaminants from the scraped paths. This assures reliable electrical contact between contacts 20 and the solder masses 72. In particular, the tips of the asperities aid in making contact with the solder masses 72. Because the cap metal in layer 34 on the tip of each asperity is a substantially oxidation resistant metal, it normally does not have any substantial oxide or contaminant layer. Thus, the solder masses and contacts form a firm, reliable electrical interconnection. This action is repeated at each contact unit and with each solder mass 72 on the surface of the microelectronic element, so that reliable interconnections are formed simultaneously between all of the solder masses 72 and all of the internal conductors 69 of substrate 68. The electrical connection achieved by mechanical interengagement of the element may be used as a test connection, so that microelectronic element 70, its connections to substrate 68 and the other elements connected to the same substrate can be tested and operated under power. This test also serves to test electrical continuity between the solder masses 72 and contacts 20. If a defective connection or component is identified during the test, the same can be removed and replaced readily. Ordinarily, the connector and contacts can be reused.

Figure 4:
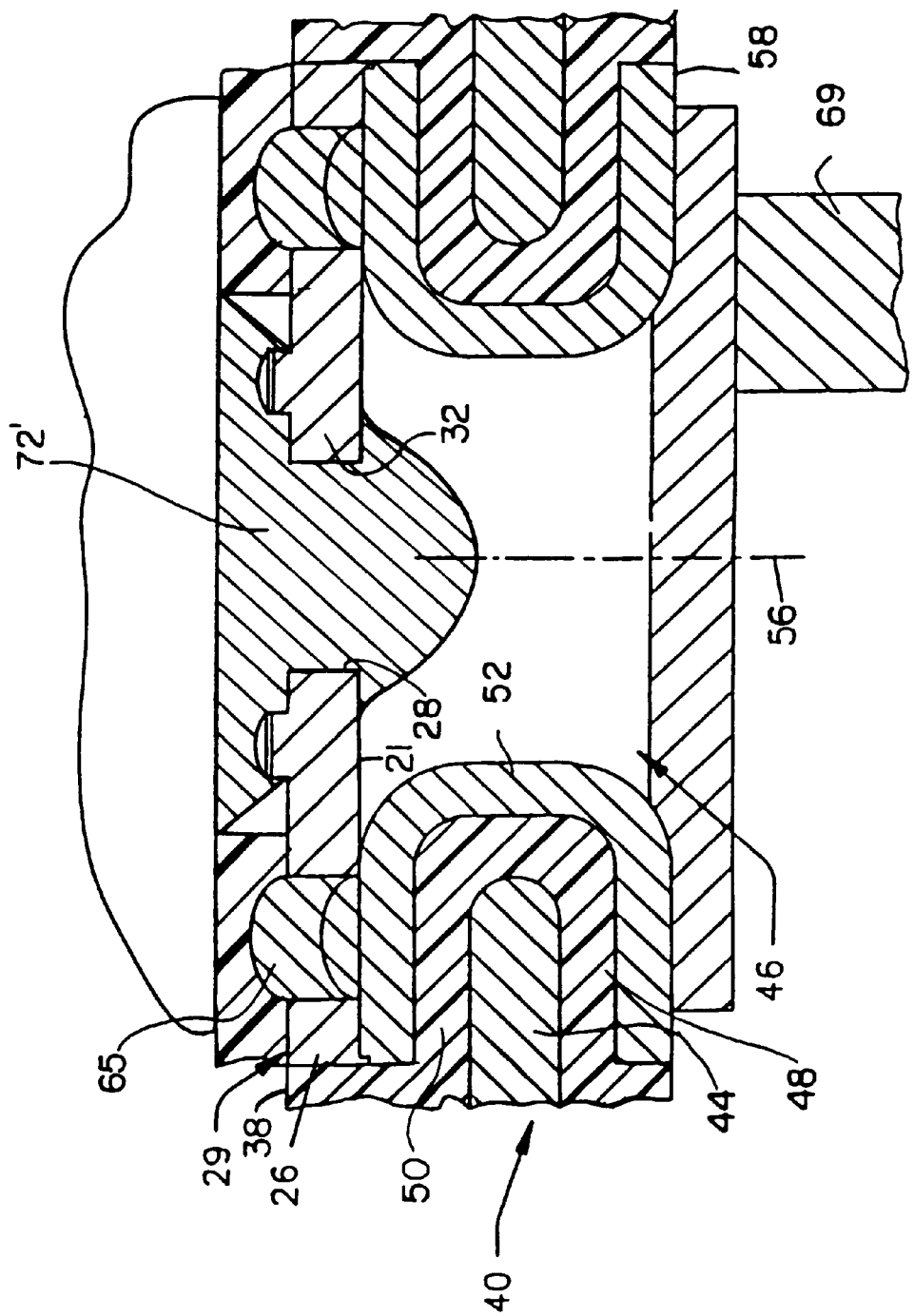
FIG. 4 is a view similar to FIG. 3 but depicting a later stage of the process.

Following completion of the testing step, the engaged solder masses and contacts are heated to an elevated bonding temperature sufficient to soften the solder. Preferably, this heating is accomplished without disengaging the solder masses from the contacts. The solder masses remain in engagement with the contacts from completion of the testing step throughout the remainder of the process. The bonding temperature is sufficient to soften the solder, as by converting some or all of the solder to a liquid phase. The solder masses and contacts may be heated by exposing the entire assembly to any suitable heating medium, such as a hot gas, radiant energy or the like. As the solder softens, each tab 20 springs back from the deformed condition of FIG. 3 towards its original, undeformed shape. As shown in FIG. 4, the distal ends or tips of the tabs penetrate into the solder mass. Although the present invention is not limited by any theory of operation, it is believed that the wiping action between the contacts and the surface of the solder mass during the engagement step, and particularly, the scraping action of the asperities on the contacts facilitates penetration of the solder mass surface by the contacts. It is believed that disruption of the oxide layer during the wiping and scraping action materially reduces the coherence of the oxide layer after softening of the solder masses. This in turn allows the contact tips to break through the oxide layer readily and to enter into the substantially pure, unoxidized solder beneath the oxide layer. The wiping action also tends to remove oxides or other contaminants from the surfaces of the contact tips.

Because the tips of the contacts are immersed in the pure, unoxidized solder, they are readily wetted by the solder. Provided that at least some portions of the contact tips are substantially free of oxidational or other impurities at this stage of the process, the pure solder can effectively wet the contact tips. No fluxes or other extraneous chemical agents are required. The assembly desirably is held at the elevated bonding temperature for a period sufficient to ensure that all parts of the assembly reach the bonding temperature. The contacts tend to recover and penetrate into the solder masses to substantially instantaneously after the solder masses soften. When the solder wets the contact tips, it tends to flow along the surfaces of the contacts under the influence of capillary action. This tends to draw the solder outwardly, away from the tips of the contacts and towards the anchor regions of the contacts. The solder mask layer 67 blocks such outward flow. Where the solder mask layer includes a material such as a thermoplastic material or other material which can be softened by heat, the solder mask may be brought to a flowable condition when the assembly is heated to the bonding temperature. The solder mask layer thus flows into conforming contact with the surface 75 of the microelectronic element and bonds to the surface. This forms a seal which encloses each contact and solder mass in an individual cavity, thus protecting the connections from the environment. Alternatively or additionally, the solder mask layer may include an adhesive, such as an acrylate adhesive, which bonds to surface 75.

After the assembly has been heated to the bonding temperature, it is cooled to a temperature below the bonding temperature, typically to room temperature, so as to resolidify the solder. The resulting assembly includes solid solder masses 72 penetrated by the contact tabs 20 and metallurgically bonded to the contact tabs. Each solder mass protrudes generally in an axial or Z direction, generally perpendicular to the top surface 38 of the connector body and generally parallel to the axis 56 of the associated hole 46 in the connector body. Thus, each solder mass extends axially through the center of one ring-like anchor region 26. The contact tabs associated with such tabs associated with such ring-like anchor region extend generally radially inwardly into the solder mass. This configuration provides a particularly strong bond. Most preferably, the array of contact tabs penetrating into each solder mass substantially surrounds the solder mass in all radial directions. Thus, movement of the solder masses relative to the contacts in any radial or X-Y direction tends to force the contact into even more intimate engagement with one or more of the contact tabs. Although the contact tabs are illustrated in FIG. 4 as being fully restored to the original, undeformed condition, this is not essential. Thus, the contact tabs, after the softening and cooling steps, may have some residual deformation in the axial direction, into the hole, so that each contact tab slopes both axially and radially.

Figure 5:
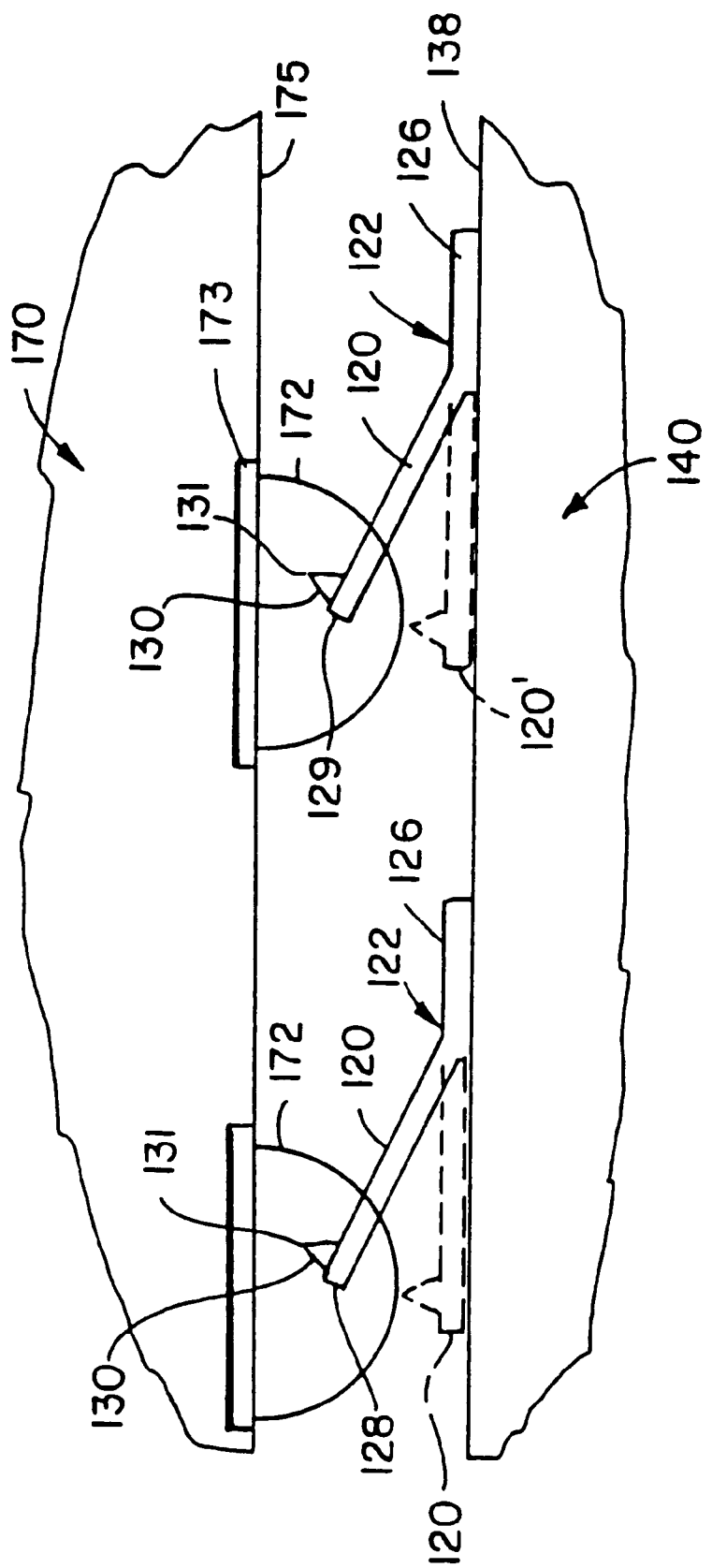
FIG. 5 is a fragmentary elevational view depicting components used in a further embodiment of the invention.

Other contact configurations may be employed. For example, as illustrated in FIG. 5, a microelectronic element or first element 170 having terminals 173 on its rear surface 175 and solder masses 172 on the terminals may be engaged with a connector or second element 140 having contacts 122 in the form of elongated strips on the front surface 138 of the element body. Each contact 122 has an anchor portion 126 connected to the internal electrical element or circuitry (not shown) of second element 140 and also has a cantilevered elongated tab 120 having a sharp asperity 130 at the distal end or tip 128 of the tab remote from the anchor portion 126. In its undeformed condition, each tab extends oblique to surface 138. When the first element 170 is forced towards the second element 140, solder masses 172 bend the tabs downwardly to the deformed position shown at 120' in broken lines in FIG. 5. This action causes the tips of the tabs, and particularly the asperities 130, to move in horizontal directions generally parallel to the surface 138 of the second element and generally transverse to the motion of the solder masses and first element 170, thus causing the tips of the tabs and particularly the aperities, to wipe the surfaces of the solder masses. Here again, the solder masses are heated, as by heating both elements. The contact tabs 120 spring back at least partially towards their undeformed positions and thus penetrate into the solder masses. Once again, after the assembly is cooled and the solder masses resolidified, each solder mass has a contact tab penetrating into it and metallurgically bonded to it.

The contacts described above can be adapted to provide various levels of interengagement force between each contact and the engaged mating electrical element. Interengagement forces between about 0.5 and about 5 grams force per engaged contact or tab are preferred in typical microelectronic applications. The total interengagement force per contact unit, and hence the total interengagement force per solder mass, desirably is between about 2 and about 20 grams force. With the sharp-edged asperity structures discussed above, these relatively small interengagement forces nonetheless provide effective scraping and wiping action. The ability to provide effective scraping action at relatively low force levels is especially significant where numerous contacts must be engaged with numerous solder masses. The degree of wipe or relative movement between the asperity edge and the mating surface during contact engagement can be relatively small, typically less than about 20 microns and usually between about 5 and 10 microns. Even this small relative movement however is enough for the sharp features of the asperity tips to break through the contaminants on the surface of the solder masses.

In the embodiments discussed above, the bonding material in the masses 72 is a solder. Other softenable bonding materials can be employed, such as polymeric materials filled with conductive particles. For example, partially-cured or "B-staged" epoxy resins, polyimide-siloxane resins or thermoplastic polymers filled with metallic particles may be employed. The metallic particles may be formed from metals such as silver, gold, palladium and combinations and alloys thereof, such as silver-palladium, silver alloys and gold alloys.

As these and other variations and combinations of the features set forth above can be utilized without departing from the invention, the foregoing description of the preferred embodiments should be taken by way of illustration rather than by way of limitation of the invention as defined by the claims.

What is claimed is:

1. An electrically connected article comprising:
   (a) a first element having a structure with at least one terminal thereon and a mass of a bonding material adhering to said terminal, said bonding material mass having an outer surface; and
   (b) a second element including a body having one or more openings therein and one or more contacts thereon, each said contact including an anchor portion secured to said body adjacent one of said openings and at least one tab projecting from such anchor portion and having a distal end remote from the anchor portion overlying said opening within said body, the distal end of each said tab penetrating said outer surface of one said mass of bonding material on the first element in alignment with said opening in said body and being bonded thereto.

2. An article as claimed in claim 1 wherein each said contact includes an annular anchor portion defining a central axis and a plurality of tabs projecting inwardly towards said central axis, each said mass of bonding material being received within the annular anchor portion of one said contact and said outer surface of each said mass of bonding material being penetrated by the tabs of such contact.

3. An article as claimed in claim 1, wherein said bonding material is a heat activatable bonding material.

4. An article as claimed in claim 3, wherein said bonding material is a solder.

5. An article as claimed in claim 4, wherein said solder includes one or more metals selected from the group consisting of lead, tin, silver, indium and bismuth.

6. An article as claimed in claim 2, wherein said bonding material is a solder and wherein said anchor region of each said contact is covered by a solder mask, said solder in each said mass not wetting said solder mask, whereby said solder mask limits wicking of said solder along said tabs.

7. An article as claimed in claim 6, wherein said solder mask forms a bond between said first element and said second element.

8. An article as claimed in claim 7, wherein said solder mask includes a thermoplastic material.

9. An article as claimed in claim 1, wherein said bonding material includes a polymeric material.

10. An article as claimed in claim 1, wherein said distal end of each said tab has asperities thereon.

11. An article as claimed in claim 10, wherein each said asperity is submerged in one said mass of bonding material.

12. An article as claimed in claim 1, wherein said one or more contacts include one or more metals selected from the group consisting of tin, copper, silver, lead, palladium, gold and alloys and combinations thereof, said one or more metals being present at surfaces of the contacts which engage said masses of bonding material.

13. An article as claimed in claim 1, wherein said distal end of each said tab is deflected into said opening within said body upon engagement with said mass of bonding material.

14. An article as claimed in claim 1, wherein said mass of bonding material is received within said opening within said body.

15. An article as claimed in claim 1, wherein said distal end of each said tab is deflected in a direction transverse to a plane containing the remaining portion of said tab upon engagement with said mass of bonding material.

16. An electrically connected article comprising:
   (a) a first element having a structure with at least one terminal thereon and a mass of a bonding material adhering to said terminal, said bonding material mass having an outer surface; and (b) a second element having a body with one or more contacts thereon, each said contact including an anchor portion secured to said body, an opening and at least one tab projecting from such anchor portion and having a distal end remote from the anchor portion and extending into said opening, the distal end of each said tab penetrating said outer surface of one said mass of bonding material on the first element and being bonded thereto.

17. An article as claimed in claim 16, wherein said distal end of each said tab has an asperity thereon.

18. An article as claimed in claim 16, wherein each said contact includes an annular anchor portion defining said opening and a central axis and a plurality of tabs projecting inwardly towards said central axis, each said mass of bonding material being received within the annular anchor portion of one said contact and said outer surface of each said mass of bonding material being penetrated by the tabs of such contact.

19. An article as claimed in claim 16, wherein said body including an opening in alignment with said opening within said contact.

20. An article as claimed in claim 19, wherein said distal end of each said tab is deflected into said opening within said body upon engagement with said mass of bonding material.

21. An article as claimed in claim 19, wherein said mass of bonding material is received within said opening within said body.

22. An article as claimed in claim 16, wherein said distal end of each said tab is deflected in a direction transverse to a plane containing the remaining portion of said tab upon engagement with said mass of bonding material.

23. An electrically connected article comprising:

(a) a first element having a structure with at least one terminal thereon and a mass of a bonding material adhering to said terminal, said bonding material mass having an outer surface; and (b) a second element having a body with one or more contacts thereon, each said contact including an anchor portion secured to said body and at least one tab projecting from such anchor portion and having a distal end remote from the anchor portion, the distal end of each said tab penetrating said outer surface of one said mass of bonding material on the first element when the temperature of said mass is substantially below its melting temperature and then penetrating into said mass upon heating said mass to a temperature sufficient to soften said mass for bonding said distal end thereto, wherein said body includes an opening and said tab being resilient whereby said distal end of each said tab is deflected into said opening within said body upon initial engagement with said mass of bonding material.

24. An article as claimed in claim 23, wherein said distal end of each said tab is deflected in a direction transverse to a plane containing the remaining portion of said tab upon engagement with said mass of bonding material.

25. An article as claimed in claim 23, wherein each said contact includes an annular anchor portion defining a central axis and a plurality of tabs projecting inwardly towards said central axis, each said mass of bonding material being received within the annular anchor portion of one said contact and said outer surface of each said mass of bonding material being penetrated by the tabs of such contact.

26. An article as claimed in claim 23, wherein said distal end of each said tab has an asperity thereon.

27. An electrically connected article comprising:

(a) a microelectronic element having a structure with at least one terminal thereon and a mass of a bonding material adhering to said terminal, said bonding material mass having an outer surface;

(b) a connector body; and (c) one or more contacts on said connector body, each said contact including an anchor portion secured to said body and at least one tab projecting from such anchor portion and having a distal end remote from the anchor portion, the distal end of each said tab penetrating said outer surface of one said mass of bonding material on the first element and being bonded thereto, wherein said distal end of each said tab is deflected in a direction transverse to a plane containing said anchor portion upon engagement with said mass of bonding material.

28. An article as claimed in claim 27, wherein said distal end of each said tab has an asperity thereon.

29. An article as claimed in claim 27, wherein said tab projects upwardly away from said connector body towards said microelectronic element.

30. An article as claimed in claim 27, wherein each said contact includes an annular anchor portion defining a central axis and a plurality of tabs projecting inwardly towards said central axis, each said mass of bonding material being received within the annular anchor portion of one said contact and said outer surface of each said mass of bonding material being penetrated by the tabs of such contact.

31. An electrically connected article comprising:

(a) a microelectronic element having a structure with at least one terminal thereon and a mass of a bonding material adhering to said terminal, said bonding material mass having an outer surface;

(b) a connector body having one or more openings therein; and (c) one or more contacts on said connector body adjacent one of said openings, each said contact including an anchor portion secured to said body and at least one tab projecting from such anchor portion and having a distal end remote from the anchor portion overlying said opening in said body, the distal end of each said tab penetrating said outer surface of one said mass of bonding material on the first element in alignment with said opening in said body when the temperature of said mass is substantially below its melting temperature and then penetrating into said mass upon heating said mass to a temperature sufficient to soften said mass for bonding said distal end thereto.

32. An article as claimed in claim 31, wherein said contact includes an opening in alignment with said opening in said body.

33. An electrically connected article comprising:

(a) a first element having a structure with at least one terminal thereon and a mass of a bonding material adhering to said terminal, said bonding material mass having an outer surface; and (b) a second element having a body with one or more contacts thereon, each said contact including an anchor portion secured to said body and at least one tab projecting from such anchor portion and having a distal end remote from the anchor portion, the distal end of each said tab penetrating said outer surface of one said mass of bonding material on the first element when the temperature of said mass is substantially below its melting temperature and then penetrating into said mass upon heating said mass to a temperature sufficient to soften said mass for bonding said distal end thereto, wherein said distal end of each said tab is deflected in a direction transverse to a plane containing the remaining portion of said tab upon engagement with said mass of bonding material.

34. An article as claimed in claim 33, wherein each said contact includes an annular anchor portion defining a central axis and a plurality of tabs projecting inwardly towards said central axis, each said mass of bonding material being received within the annular anchor portion of one said contact and said outer surface of each said mass of bonding material being penetrated by the tabs of such contact.

* * * * *

UNITED STATES PATENT AND TRADEMARK OFFICE
CERTIFICATE OF CORRECTION

PATENT NO.    : 5,980,270
DATED         : November 9, 1999
INVENTOR(S)   : FJELSTAD, et al.

It is certified that error appears in the above-identified patent and that said Letters Patent is hereby corrected as shown below:

Column 6, line 3, "92" should read --66--.
Column 6, line 4, "68" should read --92--.
Column 6, line 36, cancel the "-".

Signed and Sealed this

Eighteenth Day of July, 2000

*Attest:*

Q. TODD DICKINSON

*Attesting Officer*          *Director of Patents and Trademarks*